US010692483B1

(12) United States Patent
Hsu

(10) Patent No.: US 10,692,483 B1
(45) Date of Patent: Jun. 23, 2020

(54) ACTIVE NOISE CANCELLATION DEVICE AND EARPHONE HAVING ACOUSTIC FILTER

(71) Applicant: METAL INDUSTRIES RESEARCH & DEVELOPMENT CENTRE, Kaohsiung (TW)

(72) Inventor: Tai-Hsin Hsu, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 53 days.

(21) Appl. No.: 16/218,922

(22) Filed: Dec. 13, 2018

(51) Int. Cl.
*H03B 29/00* (2006.01)
*G10K 11/178* (2006.01)
*H04R 1/10* (2006.01)

(52) U.S. Cl.
CPC .. *G10K 11/17823* (2018.01); *G10K 11/17854* (2018.01); *G10K 11/17861* (2018.01); *H04R 1/1083* (2013.01); *G10K 2210/3028* (2013.01)

(58) Field of Classification Search
CPC ..................................................... H03B 29/00
See application file for complete search history.

(56) References Cited

U.S. PATENT DOCUMENTS

2008/0159554 A1* 7/2008 Sung .................... G10K 11/178 381/71.6
2013/0028435 A1* 1/2013 Christoph ............ H04R 1/1083 381/71.6
2013/0311176 A1* 11/2013 Brown ................. H04R 1/1091 704/233
2016/0171962 A1* 6/2016 Jenkins ................ H04R 1/1083 381/71.6
2017/0127171 A1* 5/2017 Haworth .............. H04R 1/1083
2018/0005622 A1* 1/2018 Kyllonen ............. H04R 1/1016
2018/0020281 A1* 1/2018 Wurtz .................. G10K 11/178
2018/0098146 A1* 4/2018 Lin ...................... H04R 1/1083
2018/0151172 A1* 5/2018 Min ................. G10K 11/17881
2019/0191237 A1* 6/2019 Wang ................... H04R 1/1083
2019/0238964 A1* 8/2019 Sax ...................... H04R 1/1083
2019/0279610 A1* 9/2019 Baker .................... H04R 3/002
2020/0084535 A1* 3/2020 Perkmann ............ H04R 1/1083

FOREIGN PATENT DOCUMENTS

TW I609363 12/2017

* cited by examiner

*Primary Examiner* — Olisa Anwah
(74) *Attorney, Agent, or Firm* — WPAT, PC

(57) ABSTRACT

An active noise cancellation device having an acoustic filter includes: a casing, an active noise cancellation unit, a speaker, a noise cancellation processor and an acoustic filter. The casing includes a first channel and a second channel, wherein a channel length of the first channel is greater than a channel length of the second channel. The active noise cancellation unit includes an external microphone disposed outside the casing. The active noise cancellation is configured to detect an ambient noise, wherein a location of the external microphone corresponds to a location of the first external end of the first channel. The speaker is disposed at a second external end of the second channel, and is configured to output a phase-inverted signal of the ambient noise. The noise cancellation processor electrically couples with the external microphone and the speaker. The acoustic filter is disposed inside the first channel.

13 Claims, 6 Drawing Sheets

ACTIVE NOISE CANCELLATION DEVICE AND EARPHONE HAVING ACOUSTIC FILTER

BACKGROUND

Technical Field

The present invention relates to a noise cancellation device, and in particular, to an active noise cancellation device, a circumaural earphone, and an in-ear earphone.

Related Art

According to a most common conventional noise suppression technology, noise suppression is implemented in most cases by passively absorbing noise energy by using various sound absorption materials. However, in a low frequency status, a wavelength of a sound is far greater than a thickness of a general sound absorption material. For example, a sound whose frequency is 100 Hz has a wavelength about 3.4 meters at sea level and under the normal atmospheric temperature. Therefore, transmission of a low frequency sound can be effectively blocked only by using a very thick and heavy sound absorption material. However, for general application, this passive noise cancellation technology is not ideal for a capability of isolating a low-frequency noise. Therefore, during practical application, according to a passive noise cancellation method, a balance often needs to be achieved in a problem of contradiction between effective cancellation of a low-frequency noise and a sound absorption material, wherein the sound absorption material may occupy very large space and have a large size and a high cost.

To be capable of effectively resolving the foregoing problem, an active noise control (ANC) theory using an extra sound source to cancel a noise has been widely studied and developed in depth for years. A basic principle of an active noise control system is mainly using a waveform synthesis principle to generate an anti-noise sound wave having a waveform the same as a waveform of an original noise, the intensity equal to the intensity of the original noise, and a phase difference of 180 degrees from the original noise, so that the anti-noise sound wave has destructive interference to the original noise, thereby achieving an objective of reducing noise amplitude. FIG. 1 shows an original-noise waveform L1, an anti-noise waveform L2, and a residual-noise waveform L3 formed after a superposition of the original-noise waveform and the anti-noise waveform.

Taiwan patent number 1609363 discloses an active noise cancellation correction system and a speaker apparatus. Referring to FIG. 2, the related art in the patent document shows a structure of an active noise cancellation system. An external ambient noise is received by using a microphone 90. After being adjusted by an active filter 92, this noise source sends suitable frequency responses, including a suitable amplitude response and phase response, so that an earphone speaker 94 almost outputs a phase-inverted signal of the original noise source. This phase-inverted noise produced by the speaker can be exactly offset due to a superposition of this phase-inverted noise and the original noise inside an earphone ear muff 96 of a listener 8. The offset results in substantial reduction of an external noise heard by the listener 8. This is a principle of a general active noise cancellation earphone.

However, a main noise cancellation range of the general active noise cancellation earphone is a medium and low frequency range of 50 Hz to 2 KHz, and a reduction effect for a high frequency noise is not good. In addition, even if a sound in an environment can be heard, the related art does not mention that only some frequency band is heard. Therefore, in a noisy environment, to filter out most noises and hear a voice or even a sound in a particular frequency band, usually digital signal processing needs to be performed. The cost is high for the protecting a general explosive sound is implemented through high-speed digital signal processing in circuit designs.

Therefore, it needs to provide an active noise cancellation device having an acoustic filter, to resolve the foregoing problem.

SUMMARY

An objective of the present invention is to provide an active noise cancellation device having an acoustic filter, and the active noise cancellation device combines an active noise cancellation unit and the acoustic filter.

To achieve the foregoing objective, the present disclosure discloses an active noise cancellation device having an acoustic filter includes: a casing including a first channel and a second channel, wherein a channel length of the first channel is greater than a channel length of the second channel; an active noise cancellation unit including an external microphone, disposed outside the casing, and configured to detect an ambient noise, wherein a location of the external microphone corresponds to a location of the first external end of the first channel; a speaker disposed at a second external end of the second channel, and configured to output a phase-inverted signal of the ambient noise; and a noise cancellation processor electrically coupling to the external microphone and the speaker; and an acoustic filter, disposed inside the first channel.

The active noise cancellation device having an acoustic filter in the present invention combines the active noise cancellation unit (including the external microphone, the speaker, and the noise cancellation processor) and the acoustic filter to form a band pass filter, so that a sound in a particular frequency domain can pass through the casing to enter the auditory canal of the listener. For a noise passing through the first channel of the casing and to the auditory canal, the active noise cancellation unit evenly reduces noise intensity based on a frequency when the frequency is less than 1 KHz. In addition, for the noise passing through the first channel of the casing and to the auditory canal, the acoustic filter enhances a noise cancellation effect as the frequency increases while the frequency is greater than 1 KHz.

DETAILED DESCRIPTION

To make the foregoing objective, feature, and characteristic of the present invention clearer and easier to be understood, related embodiments of the present invention are described in detail in the following with reference to the drawings.

Figure 1:
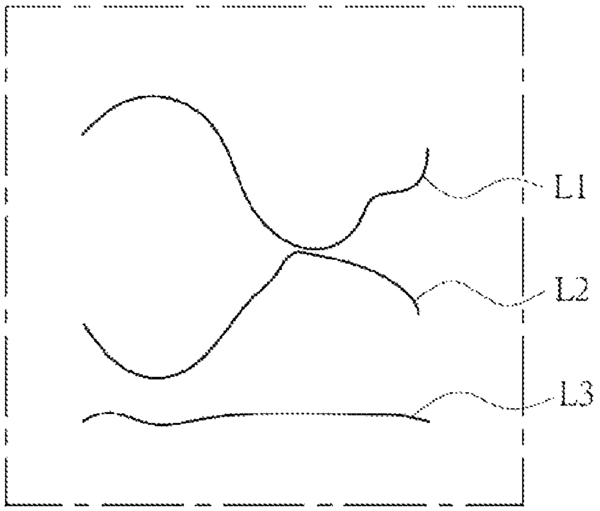
FIG. 1 (PRIOR ART)
FIG. 1 is a comparison diagram of a difference between an original-noise waveform, an anti-noise waveform, and a residual-noise waveform in the prior art.
Figure 2:
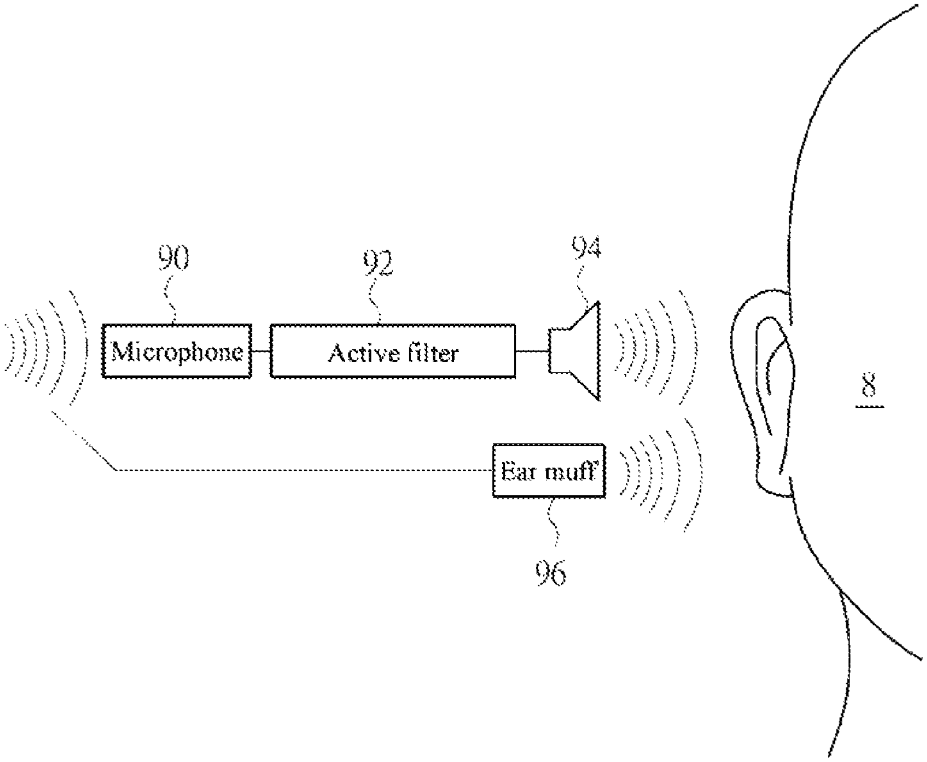
FIG. 2 (PRIOR ART)
FIG. 2 is a schematic diagram of a structure of a conventional active noise cancellation system.
Figure 3:
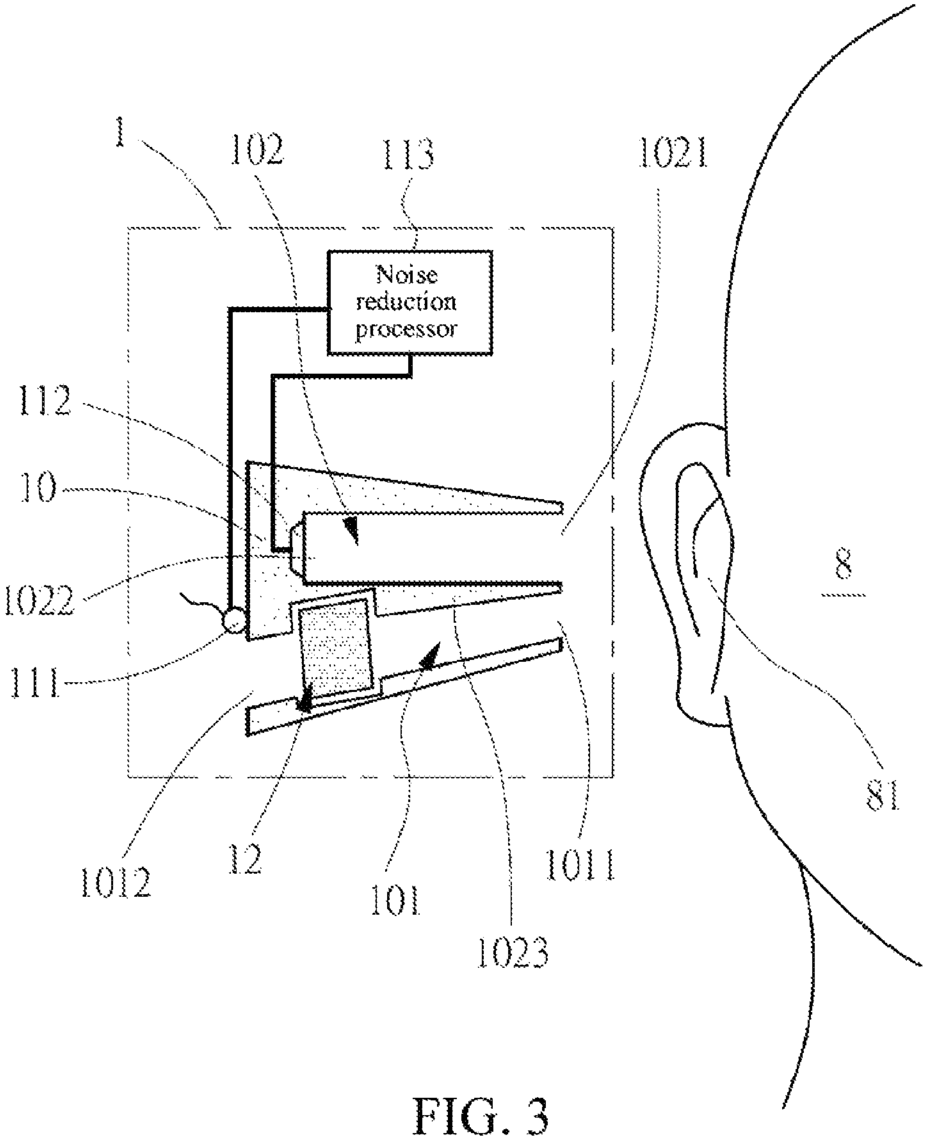
FIG. 3 is a schematic diagram of a structure of an active noise cancellation device having an acoustic filter according to a first embodiment of the present invention.

FIG. 3 is a schematic diagram of a structure of an active noise cancellation device 1 having an acoustic filter according to a first embodiment of the present invention. The active noise cancellation device 1 includes: a casing 10, an active noise cancellation unit (including an external microphone 111, a speaker 112, and a noise cancellation processor 113), and an acoustic filter 12. The casing 10 includes a first channel 101 and a second channel 102, and a channel length between a first internal end 1011 and a first external end 1012 of the first channel 101 is greater than a channel length between a second internal end 1021 and a second external end 1022 of the second channel 102. The first internal end 1011 and the second internal end 1021 refer to ends, of the channels, close to an auditory canal 81, and the first external end 1012 and the second external end 1022 refer to other ends, of the channels, away from the auditory canal 81. In this embodiment, the first channel 101 is located on a side 1023 of the second channel 102. A material of the casing 10 can be selected from the group consisting of silicone, thermoplastic elastomer (TPE), thermoplastic rubber (TPR), thermoplastic vulcanizate (TPV), thermoplastic polyurethane (TPU), thermoplastic polyether ester elastomer (TPEE), and a combination thereof.

The active noise cancellation unit includes: an external microphone 111, a speaker 112, and a noise cancellation processor 113. The external microphone 111 is disposed outside the casing 10, and is configured to detect an ambient noise, wherein a location of the external microphone 111 corresponds to a location of the first external end 1012. For example, the location of the external microphone 111 is close to the location of the first external end 1012. The speaker 112 is disposed at the second external end 1021, and is configured to output a phase-inverted signal of the ambient noise, wherein the second external end 1021 is a closed end. The noise cancellation processor 113 is electrically coupled to the external microphone 111 and the speaker 112, and is configured to perform phase-inverted processing on the ambient noise detected by the external microphone 111, and then transmit the ambient noise to the speaker 112. The speaker 112 outputs the phase-inverted signal of the ambient noise through the second channel 102, so that the ambient noise transmitted into the auditory canal 81 of the listener 8 through the first channel 101 can be reduced.

For example, the channel length of the first channel 101 is greater than the channel length of the second channel 102, and the location of the external microphone 111 is close to the location of the first external end 1012. Therefore, the noise cancellation processor 113 can perform signal and phase adjustment based on a difference between a time taken by the phase-inverted signal of the ambient noise output by the speaker 112 to pass through the second channel 102 and a time taken by the ambient noise to pass through the first channel 101. In this way, a preferable superposition effect is achieved for the ambient noise and the phase-inverted signal of the ambient noise in an area outside exits of the first internal end 1011 of the first channel 101 and the second internal end 1021 of the second channel 102, thereby achieving a preferable effect of noise cancellation.

Figure 4:
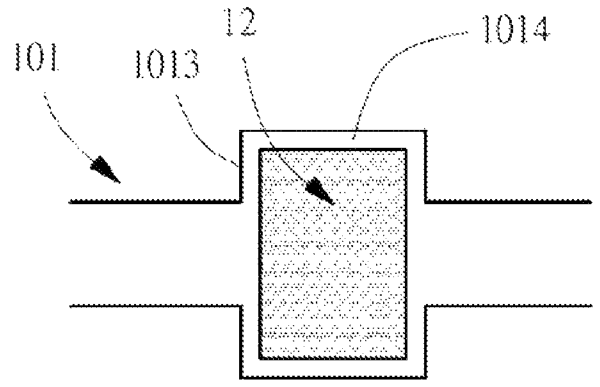
FIG. 4 is a schematic diagram of cross sections of an acoustic filter and a low pass filter tubular shape according to the present invention.
Figure 5:
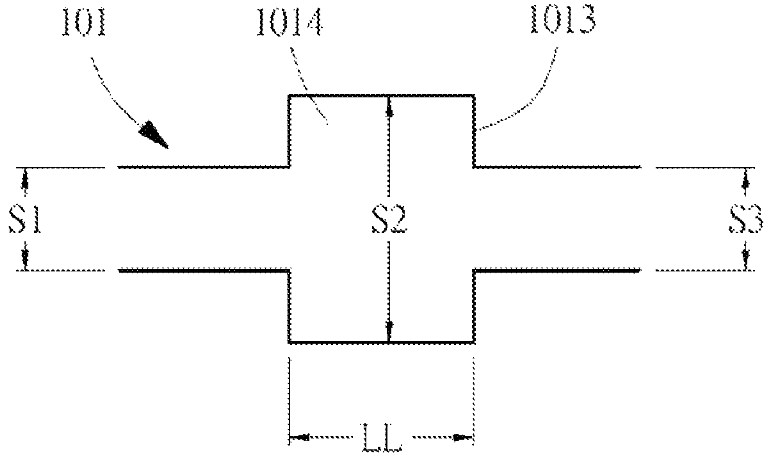
FIG. 5 is a schematic diagram of a cross section of a low pass filter tubular shape according to the present invention.

The acoustic filter 12 is disposed inside the first channel 101. Referring to FIG. 4 and FIG. 5, the first channel 101 further includes a low pass filter tubular shape 1013. The low pass filter tubular shape 1013 has a cavity 1014, and the cavity 1014 is configured to accommodate the acoustic filter 12. The low pass filter tubular shape 1013 further has a first caliber S1, a second caliber S2, a third caliber S3, and a cavity length LL. The second caliber S2 is greater than the first caliber Si and the third caliber S3, and the cavity length LL and the second caliber S2 form the cavity 1014. The low pass filter tubular shape 1013 can enhance an effect of a low pass filter.

For example, the acoustic filter 12 includes a thin film therein, and the thin film can attenuate intensity of an incoming sound. The acoustic filter 12 can apparently enhance an attenuation effect for an over 1 KHz high-frequency noise passing through the first channel 101 of the casing 10 and to the auditory canal 81 of the listener 8.

Therefore, the active noise cancellation device 1 having an acoustic filter in the present invention combines the active noise cancellation unit (including the external microphone 111, the speaker 112, and the noise cancellation processor 113) and the acoustic filter 12 to form a band pass filter, so that a sound in a particular frequency domain can pass through the casing to enter the auditory canal 81 of the listener 8. For a noise passing through the first channel 101 of the casing 10 and to the auditory canal 81, the active noise cancellation unit evenly reduces noise intensity based on a frequency when the frequency is less than 1 KHz. In addition, for the noise passing through the first channel 101 of the casing 10 and to the auditory canal 81, the acoustic filter 12 enhances a noise cancellation effect as the frequency increases while the frequency is greater than 1 KHz.

In particular, the active noise cancellation unit can have a relatively low noise cancellation effect in a range of 80 Hz to 520 Hz, enabling a main frequency of a voice of a person to pass through the active noise cancellation unit. If a noise whose frequency is over 1 KHz is greatly reduced by using the acoustic filter together, loudness of the voice of the person can be highlighted when a design is performed in coordination with an equal loudness contour (for example, ISO 226).

The active noise cancellation device having an acoustic filter in the present invention combines the active noise cancellation unit and the acoustic filter, so that a degree of freedom for adjusting a noise cancellation curve is increased, reducing development costs of processing software and hardware of the active noise cancellation. For a general active noise cancellation unit, noise cancellation processing in a low frequency domain is easy, but noise cancellation processing in a high frequency domain is difficult. However, for a general acoustic filter, a sound filtering effect is relatively good at the high frequency. Therefore, a band pass filter can be formed by combining the two, to allow a voice or an alarm sound to pass through in a noisy environment.

Figure 6:
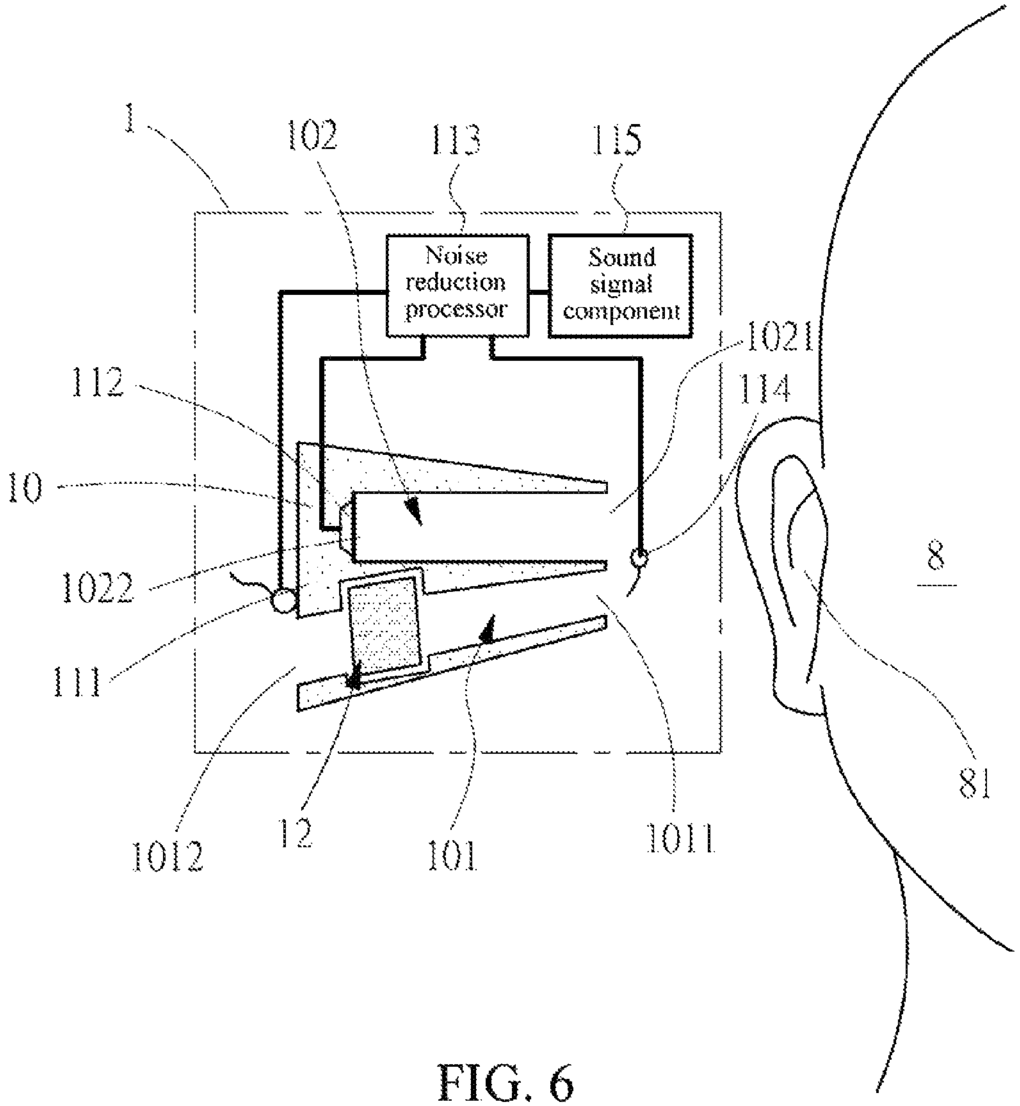
FIG. 6 is a schematic diagram of a structure of an active noise cancellation device having an acoustic filter according to another embodiment of the present invention.

Referring to FIG. 6, in another embodiment, the active noise cancellation unit 11 further includes an internal microphone 114, located near an area outside exits of the first internal end 1011 of the first channel 101 and the second internal end 1021 of the second channel 102. The internal microphone 114 is a microphone receiving an error signal. The internal microphone 114 is electrically coupled to the noise cancellation processor 113, and is configured to transmit the error signal to the noise cancellation processor 113. The external microphone 111 is a microphone for receiving a reference signal, and the external microphone 111 is also configured to transmit the reference signal to the noise cancellation processor 113. For example, by using an architecture of the active noise cancellation technology, the external microphone 111 receives a reference signal, and then the internal microphone 114 receives a reduced ambient noise (error signal). The error signal is fed back to the noise cancellation processor 113. The noise cancellation processor 113 can automatically adjust a parameter of a digital filter, such as a digital finite impulse response filter (Digital FIR Filter). The speaker 112 is equipped with a built-in amplifier, such as a class-D amplifier, being capable of receiving a signal of the noise cancellation processor 113 and converting the signal into an audio signal. The objective is to suppress a noise transmitted into the auditory canal 81 to the minimum.

In still another embodiment, the active noise cancellation unit 11 further includes a sound signal component 115. The sound signal component 115 (such as a wireless signal receiver) is electrically coupled the noise cancellation processor 113, and is configured to receive an external sound signal (such as music or a voice) and provide the external sound signal to the noise cancellation processor 113.

Figure 7:
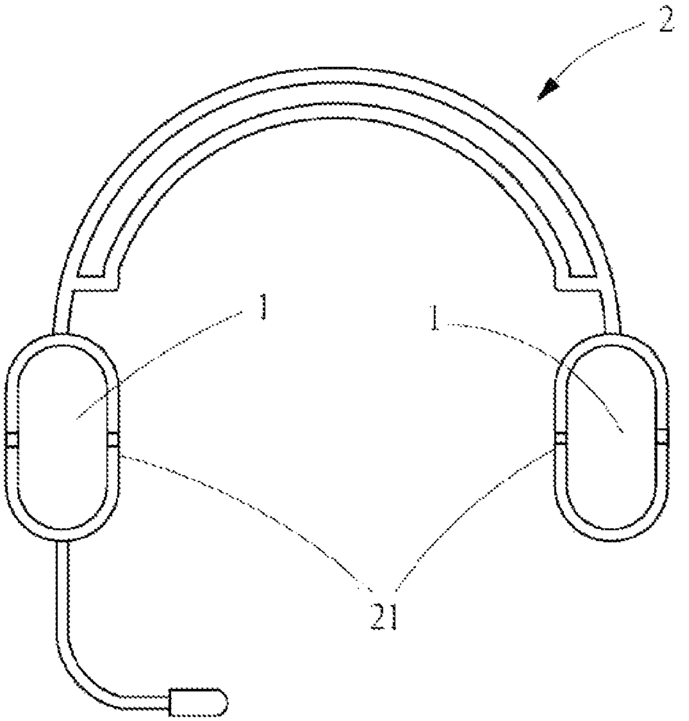
FIG. 7 is a schematic diagram of a structure of a circumaural earphone according to an embodiment of the present invention.

FIG. 7 is a schematic diagram of a structure of a circumaural earphone according to an embodiment of the present invention. The circumaural earphone 2 includes: an ear muff 21, and the active noise cancellation device 1 having an acoustic filter in the present invention. The active noise cancellation device 1 having an acoustic filter can be disposed inside the ear muff 21 of the circumaural earphone 2.

Figure 8:
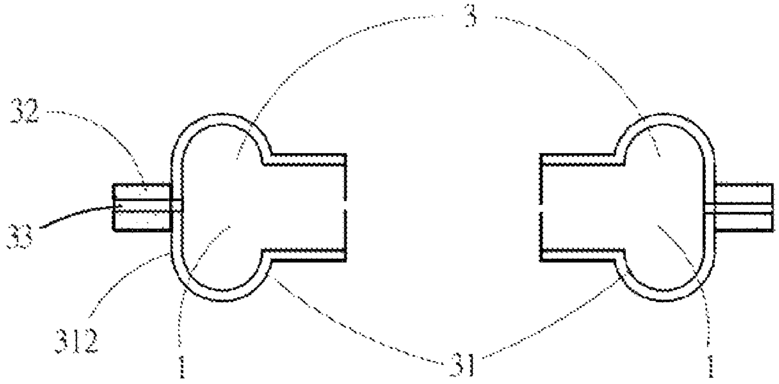
FIG. 8 is a schematic diagram of a structure of an in-ear earphone according to an embodiment of the present invention.

FIG. 8 is a schematic diagram of a structure of an in-ear earphone according to an embodiment of the present invention. The in-ear earphone 3 includes: an earphone casing 31, and the active noise cancellation device 1 having an acoustic filter in the present invention. The active noise cancellation device 1 having an acoustic filter can be disposed inside the earphone casing 31. A casing of the active noise cancellation device 1 having an acoustic filter and the earphone casing 31 are manufactured by integral formation and made of the same material. For example, the material of the casing of the active noise cancellation device 1 having an acoustic filter and the earphone casing 31 can be selected from the group consisting of silicone, TPE, TPR, TPV, TPU, TPEE, and a combination thereof. The in-ear earphone 3 further includes a bulge 32, located at an external end 312 of the earphone casing 31. After the in-ear earphone 3 is inserted into an auditory canal of a listener, the listener can conveniently catch hold of the bulge 32 and easily pull out the in-ear earphone 3. The bulge 32 has a channel 33, which is configured to enable acoustic propagation into the earphone casing 31.

Figure 9:
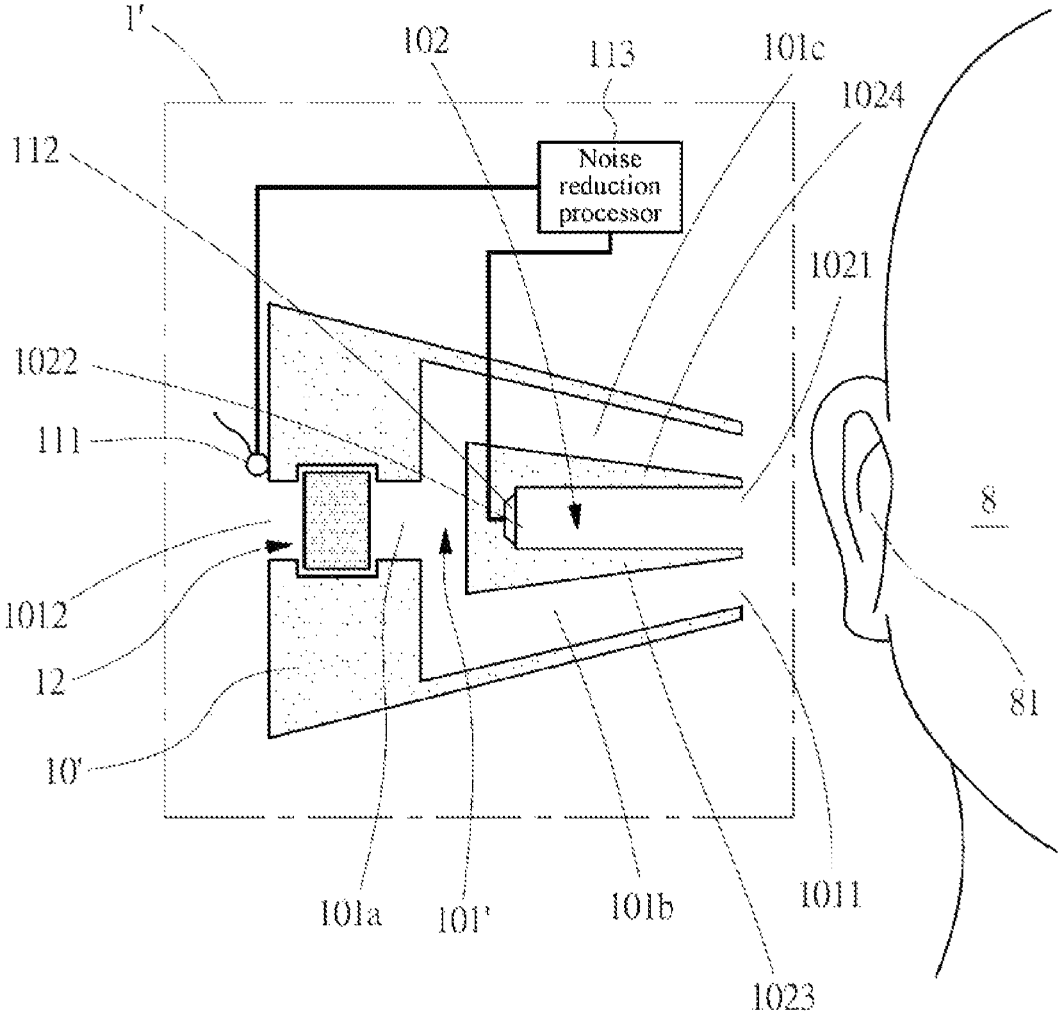
FIG. 9 is a schematic diagram of a structure of an active noise cancellation device having an acoustic filter according to a second embodiment of the present invention.

FIG. 9 is a schematic diagram of a structure of an active noise cancellation device 1' having an acoustic filter according to a second embodiment of the present invention. The active noise cancellation device 1' having an acoustic filter in the second embodiment is substantially similar to the active noise cancellation device 1 having an acoustic filter in the first embodiment, and similar components are represented by using similar reference numbers. A main difference between the two is: A first channel 101' of a casing 10' of the active noise cancellation device 1' having an acoustic filter includes a first external channel 101*a*, a first internal channel 101*b*, and a second internal channel 101*c*; the first external channel 101*a* is physically connected (e.g., communicated) with both the first internal channel 101*b* and the second internal channel 101*c*; and the first internal channel 101*b* and the second internal channel 101*c* are located on two sides 1023, 1024 of the second channel 102, wherein the acoustic filter 12 is located inside the external channel 101*a* of the first channel 101.

Similarly, the active noise cancellation device having an acoustic filter in the present invention combines the active noise cancellation unit (including the external microphone 111, the speaker 112, and the noise cancellation processor 113) and the acoustic filter 12 to form a band pass filter, so that a sound in a particular frequency domain can pass through the casing to enter the auditory canal 81 of the listener 8. For a noise passing through the first channel 101' of the casing 10 and to the auditory canal 81, the active noise cancellation unit evenly reduces noise intensity based on a frequency when the frequency is less than 1 KHz. In addition, for the noise passing through the first channel 101' of the casing 10 and to the auditory canal 81, the acoustic filter 12 enhances a noise cancellation effect as the frequency increases when the frequency is greater than 1 KHz.

The active noise cancellation device having an acoustic filter in the present invention combines the active noise cancellation unit and the acoustic filter, so that a degree of freedom for adjusting a noise cancellation curve is increased, reducing development costs of processing software and hardware of the active noise cancellation. For a general active noise cancellation unit, noise cancellation processing in a low frequency domain is easy, but noise cancellation processing in a high frequency domain is difficult. However, for a general acoustic filter, a sound filtering effect is relatively good at the high frequency. Therefore, a band pass filter can be formed by combining the two, to allow a voice or an alarm sound to pass through in a noisy environment.

The active noise cancellation device 1' having an acoustic filter in the second embodiment of the present invention can alternatively be applied to the circumaural earphone or the in-ear earphone.

The foregoing descriptions are only preferred implementations or embodiments for presenting technical means used for resolving a problem in the present invention, and are not used for limiting the implementation scope of the patent in the present invention. In other words, all equivalent changes and modifications complying with a literal meaning of the patent application scope of the present invention or performed based on the patent scope of the present invention fall within the patent scope of the present invention.

What is claimed is:

1. An active noise cancellation device having an acoustic filter, the active noise cancellation device comprising:

a casing, comprising a first channel and a second channel, wherein a channel length between a first internal end and a first external end of the first channel is greater than a channel length between a second internal end and a second external end of the second channel;

an active noise cancellation unit, comprising:

an external microphone, disposed outside the casing, and configured to detect an ambient noise, wherein a location of the external microphone corresponds to a location of the first external end;

a speaker, disposed at the second external end, and configured to output a phase-inverted signal of the ambient noise; and a noise cancellation processor, electrically coupled to the external microphone and the speaker; and an acoustic filter, disposed inside the first channel.

2. The active noise cancellation device having an acoustic filter according to claim 1, wherein the first channel is located on a side of the second channel.

3. The active noise cancellation device having an acoustic filter according to claim 1, wherein the first channel comprises a first external channel, a first internal channel and a second internal channel, the first external channel is physically connected with both the first internal channel and the second internal channel, and the first internal channel and the second internal channel are located on two sides of the second channel.

4. The active noise cancellation device having an acoustic filter according to claim 3, wherein the acoustic filter is located inside the first external channel.

5. The active noise cancellation device having an acoustic filter according to claim 1, wherein the first channel further comprises a low pass filter tubular shape, and the low pass filter tubular shape has a cavity configured to accommodate the acoustic filter.

6. The active noise cancellation device having an acoustic filter according to claim 1, wherein the acoustic filter and the active noise cancellation unit form a band pass filter.

7. The active noise cancellation device having an acoustic filter according to claim 1, wherein a material of the casing is selected from the group consisting of silicone, thermoplastic elastomer (TPE), thermoplastic rubber (TPR), thermoplastic vulcanizate (TPV), thermoplastic polyurethane (TPU), thermoplastic polyether ester elastomer (TPEE) and a combination thereof.

8. The active noise cancellation device having an acoustic filter according to claim 1, wherein the location of the external microphone is close to the location of the first external end.

9. The active noise cancellation device having an acoustic filter according to claim 1, wherein the second external end is a closed end.

10. The active noise cancellation device having an acoustic filter according to claim 1, wherein the active noise cancellation unit further comprises an internal microphone, located near an area outside exits of the first internal end of the first channel and the second internal end of the second channel.

11. The active noise cancellation device having an acoustic filter according to claim 1, wherein the active noise cancellation unit further comprises a sound signal component electrically coupled the noise cancellation processor and configured to receive an external sound signal for providing the external sound signal to the noise cancellation processor.

12. An in-ear earphone, comprising:

an earphone casing; and the active noise cancellation device having an acoustic filter according to claim 1, disposed inside the earphone casing.

13. The in-ear earphone according to claim 12, further comprising a bulge, wherein the bulge is located at an external end of the earphone casing, and the bulge has a channel configured to enable acoustic propagation into the earphone casing.

* * * * *